(12) United States Patent
Fan et al.

(10) Patent No.: US 8,355,807 B2
(45) Date of Patent: Jan. 15, 2013

(54) METHOD AND APPARATUS FOR USING AERIAL IMAGE SENSITIVITY TO MODEL MASK ERRORS

(75) Inventors: Yongfa Fan, Sunnyvale, CA (US); JenSheng Huang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 541 days.

(21) Appl. No.: 12/692,058

(22) Filed: Jan. 22, 2010

(65) Prior Publication Data

US 2011/0184546 A1   Jul. 28, 2011

(51) Int. Cl.
*G06F 19/00* (2006.01)
*G06F 17/50* (2006.01)

(52) U.S. Cl. .............. 700/108; 716/50; 716/53

(58) Field of Classification Search ........... 700/108, 700/121, 104; 250/252.1, 492.22; 716/50–54
See application file for complete search history.

(56) References Cited

U.S. PATENT DOCUMENTS

| | | | | |
|---|---|---|---|---|
| 7,117,478 | B2 * | 10/2006 | Ye et al. ................ | 700/121 |
| 7,488,933 | B2 * | 2/2009 | Ye et al. ................ | 716/50 |
| 2005/0149902 | A1 * | 7/2005 | Shi et al. ................ | 716/21 |
| 2010/0260427 | A1 * | 10/2010 | Cao et al. ................ | 382/218 |

OTHER PUBLICATIONS

Yu et al. J. Micro/Nanolith MEMS MOEMS "True process variation aware optical proximity correction with variational lithography modeling and model calibration" Jul.-Sep. 2007/ vol. 6(3) pp. 031004-103100416.*

* cited by examiner

*Primary Examiner* — Ryan Jarrett
*Assistant Examiner* — Steven Garland
(74) *Attorney, Agent, or Firm* — Park, Vaughan, Fleming & Dowler LLP; Laxman Sahasrabuddhe (57) ABSTRACT

One embodiment of the present invention provides techniques and systems for modeling mask errors based on aerial image sensitivity. During operation, the system can receive an uncalibrated process model which includes a mask error modeling term which is based at least on an aerial image sensitivity to mask modifications which represent mask errors. Next, the system can fit the uncalibrated process model using measured CD data. Note that the mask error modeling term can also be dependent on the local pattern density. In some embodiments, the mask error modeling term can include an edge bias term and a corner rounding term. The edge bias term can be based on the sensitivity of the aerial image intensity to an edge bias, and the corner rounding term can be based on the sensitivity of the aerial image intensity to a corner rounding adjustment.

20 Claims, 7 Drawing Sheets

PORTION OF MASK LAYOUT 800

METHOD AND APPARATUS FOR USING AERIAL IMAGE SENSITIVITY TO MODEL MASK ERRORS

BACKGROUND

1. Technical Field

The present invention relates to integrated circuit design and fabrication. More specifically, the present invention relates to methods and apparatuses for using aerial image sensitivity to model mask errors.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

As semiconductor design enters the deep submicron era, process model accuracy and efficiency is becoming increasingly important. Inaccuracies in the process model negatively affect the efficacy of downstream applications. For example, inaccuracies in the photolithography process model can reduce the efficacy of optical proximity correction (OPC). If the process model is computationally inefficient, it can increase the time-to-market for an integrated circuit, which can cost millions of dollars in lost revenue. Hence, it is desirable to improve the accuracy and the efficiency of a process model.

SUMMARY

Some embodiments of the present invention provide techniques and systems for modeling mask errors based on aerial image sensitivity. A mask layout can be printed for calibration purposes. Next, critical dimensions of printed features can be measured to obtain critical dimension (CD) data. The system can then receive an uncalibrated process model which includes a mask error modeling term which is based at least on an aerial image sensitivity to mask modifications which represent mask errors. For example, the mask error modeling term can include an edge bias term and/or a corner rounding term. The edge bias term's value at an evaluation point in the mask layout can be based at least on an edge bias coefficient and the sensitivity of the aerial image intensity at the evaluation point to an edge bias. The corner rounding term's value at the evaluation point can be based at least on a corner rounding coefficient and the sensitivity of the aerial image intensity at the evaluation point to a corner rounding adjustment. Note that the edge bias coefficient and the corner rounding coefficient can be represented as functions of the local pattern density.

Next, the system can determine a process model that models mask errors by fitting the uncalibrated process model using the measured CD data and the mask layout so that CDs predicted by the process model substantially match the measured CDs. The system can generally use any fitting technique for fitting the uncalibrated process model. For example, the system can use linear regression to fit the uncalibrated process model.

Once fit, the process model can then be used to determine an aerial image intensity value at an evaluation point. Specifically, the system can determine an ideal aerial image intensity value at the evaluation point using a mask layout and an aerial image intensity model. The system can then determine a mask error deviation value at the evaluation point using the mask layout, a modified mask layout that models mask errors, and the aerial image intensity model. For example, the mask error deviation value can include an edge bias deviation value and/or a mask corner rounding deviation value. The edge bias deviation value at the evaluation point can be determined using an edge-biased mask layout, the mask layout, and the aerial image intensity model. The corner rounding deviation value at the evaluation point can be determined using a rounded mask layout, the mask layout, and the aerial image intensity model. Next, the system can determine the aerial image intensity value at the evaluation point by combining the ideal aerial image intensity value and the mask error deviation value.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
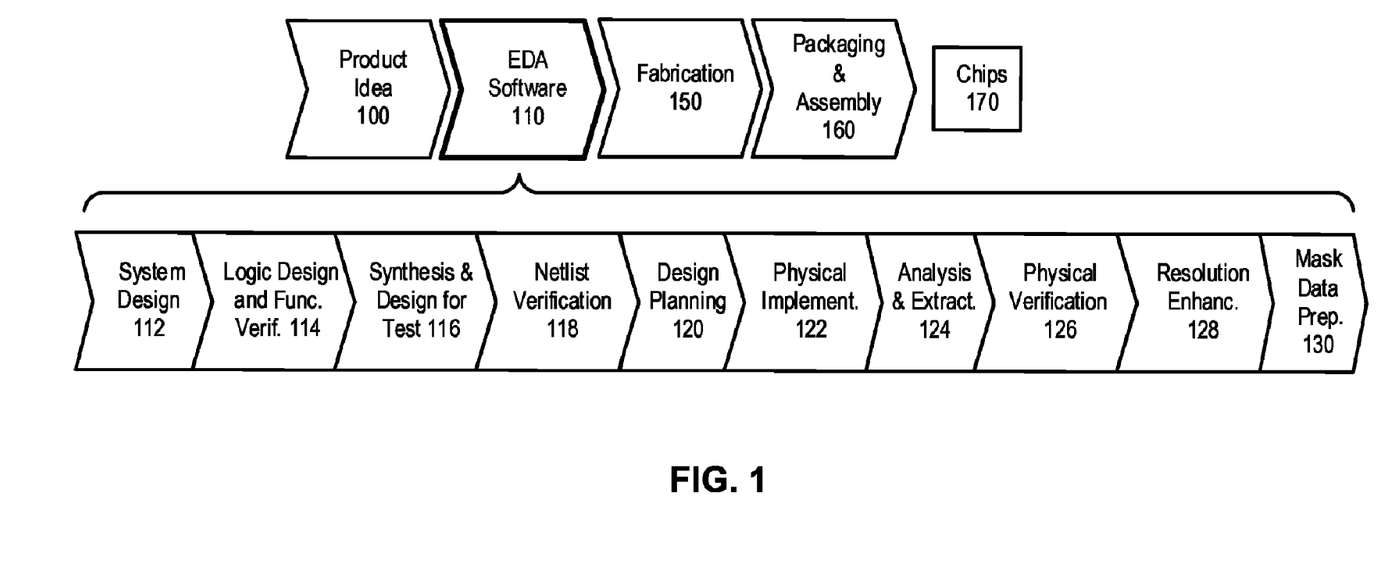
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a VHDL or Verilog design can be created and checked for functional accuracy.

In the synthesis and design step 116, the VHDL/Verilog code can be translated to a netlist, which can be optimized for the target technology. Further, in this step, tests can be designed and implemented to check the finished chips. In the netlist verification step 118, the netlist can be checked for compliance with timing constraints and for correspondence with the VHDL/Verilog code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to ensure correctness for manufacturing, electrical issues, lithographic issues, and circuitry.

In the resolution enhancement step 128, geometric manipulations can be performed on the layout to improve manufacturability of the design.

Finally, in the mask data preparation step 130, the design can be taped-out for production of masks to produce finished chips.

Embodiments of the present invention can be used in one or more of the above-described steps.

A process model models the behavior of one or more semiconductor manufacturing processes which typically involve complex physical and chemical interactions. A process model is usually determined by fitting kernel coefficients and/or parameters to empirical data. The empirical data is usually generated by applying the semiconductor manufacturing processes that are being modeled to one or more test layouts.

Figure 2:
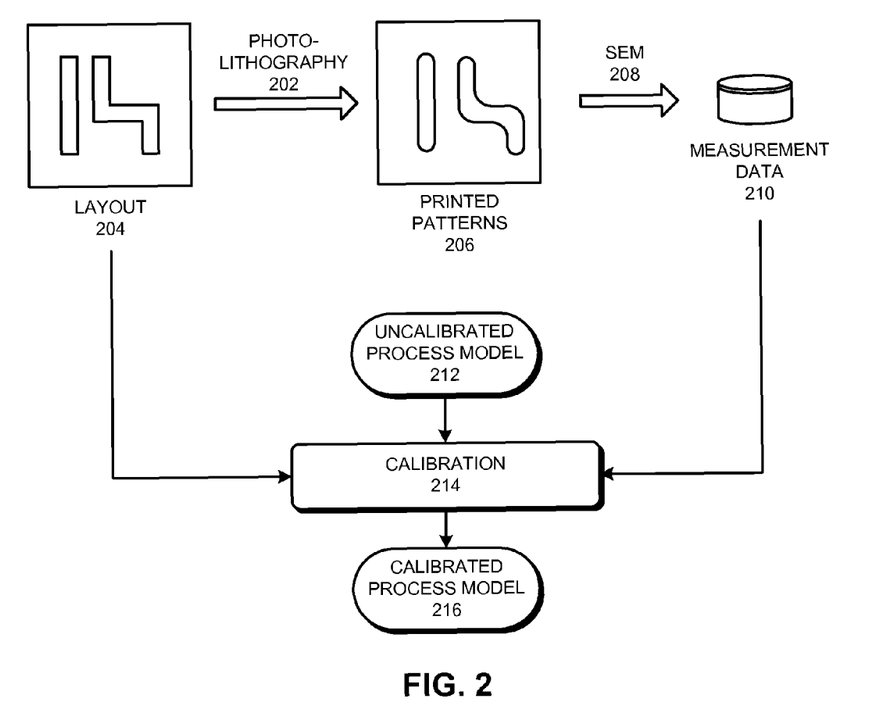
FIG. 2 illustrates how a process model can be determined using empirical data in accordance with some embodiments of the present invention.

FIG. 2 illustrates how a process model can be determined using empirical data in accordance with some embodiments of the present invention.

Photolithography process 202 can be used to print layout 204 on a wafer to obtain printed patterns 206. Next, a scanning electron microscope (SEM) 208 can be used to measure critical dimensions (CDs) of printed patterns 206 to obtain measurement data 210. Note that the CD measurement is typically performed after one or more post-exposure processes, and the CD measurement data is sometimes referred to as process data or empirical data.

Next, the system can calibrate or fit an uncalibrated process model using layout 204 and measurement data 210. Specifically, layout 204 and measurement data 210 be used to calibrate (block 214) uncalibrated process model 212 to obtain calibrated process model 216. Note that calibrated process model 216 models the behavior of photolithography process 202.

For example, uncalibrated process model 212 may be represented as $$\sum_i (C_i \cdot K_i),$$

where $K_i$ is a modeling function or kernel, and $C_i$ is a coefficient which is associated with $K_i$. The modeling function $K_i$ may also include parameters which are also fit during calibration. During calibration, the $C_i$ values and any parameter values may be determined by fitting them using layout 204 and measurement data 210.

Ideally, we may want to determine coefficient and/or parameter values which will cause the predicted data to exactly match the empirical data. However, an exact fit is usually not possible, and even if it is possible, it may not be desirable because the resulting process model may not interpolate and/or extrapolate properly. Hence, statistical fitting techniques are typically used to determine the parameters and/or coefficients so that the error between the empirical data and the predicted data is minimized.

Specifically, in some embodiments, the system can use a linear regression technique or a least-squares fitting technique to determine the parameter and/or coefficient values. In other embodiments, the system can create a cost function that is based on the residual error (e.g., the difference between the measured CD and the predicted CD), and use an optimization technique to determine coefficient values that minimize the cost function.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Once a process model is determined, it can be used in a number of applications during the design and manufacture of a semiconductor chip.

Figure 3:
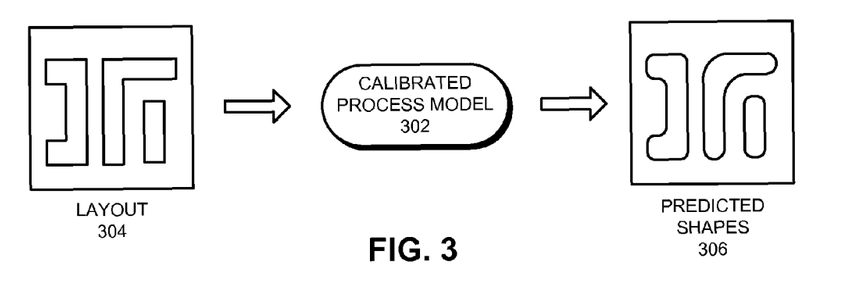
FIG. 3 illustrates how a process model can be used to predict shapes on the wafer in accordance with some embodiments of the present invention.

FIG. 3 illustrates how a process model can be used to predict shapes on the wafer in accordance with some embodiments of the present invention.

Calibrated process model 302 may be used to predict the shapes that are expected to be printed on the wafer. Specifically, calibrated process model 302 can take layout 304 as input and generate predicted shapes 306 as output. A user can view predicted shapes 306 to determine whether the design intent in layout 304 is expected to be manufactured properly.

Figure 4:
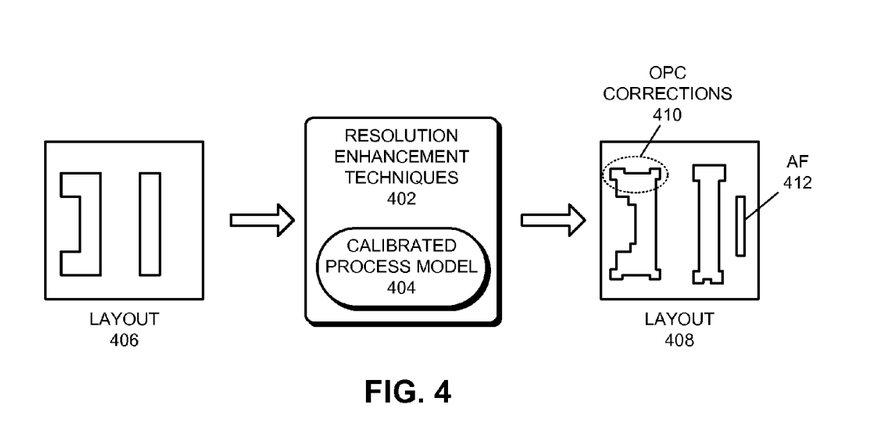
FIG. 4 illustrates how a process model can be used to support resolution enhancement techniques (RETs) in accordance with some embodiments of the present invention.

FIG. 4 illustrates how a process model can be used to support resolution enhancement techniques (RETs) in accordance with some embodiments of the present invention.

RETs 402 can use calibrated process model 404 to modify layout 406 to obtain layout 408, which is expected to eliminate or at least substantially reduce manufacturing problems. Specifically, calibrated process model 404 can be used to perform OPC corrections 410, and to place assist features (AFs), such as AF 412.

The optical model in a photolithography process model is usually based on the Hopkins model which models the behavior of partially coherent optical systems.

Figure 5:
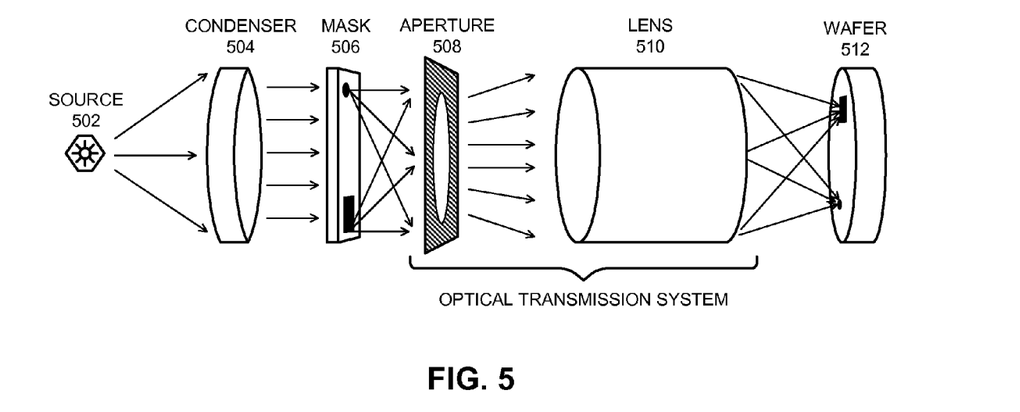
FIG. 5 illustrates a typical optical system in accordance with some embodiments of the present invention.

FIG. 5 illustrates a typical optical system in accordance with some embodiments of the present invention.

Radiation from source 502 can be collimated by condenser 504. The collimated light can then pass through mask 506, aperture 508, lens body 510, and form an image on wafer 512.

The Hopkins model can be expressed as:

$$I = \iiiint J(x',y';x'',y'') \otimes L(x,y;x',y') \otimes :L^*(x,y;x'',y'') \, dx'dy'dx''dy'', \quad (1)$$

where, I is the optical intensity at point (x, y) on the wafer, $L(x,y;x',y')$ is a lumped model of the light source and the mask, $L^*$ is the complex conjugate of L, and $J(x',y';x'',y'')$ models the incoherence between two points of light on the mask. The lumped model (L) essentially treats the mask as an array of light sources. In particular, $L(x,y;x',y')$ models point $(x',y')$ on the mask as a point source, and $J(x',y';x'',y'')$ models the incoherence between the light emanating from points $(x',y')$ and $(x'',y'')$ on the mask. The lumped model (L) can be represented as a convolution between the mask and the source. For example, the lumped model can be represented using a mask model and a source model as follows:

$$L(x,y;x',y') = M(x',y') \otimes K(x,y;x',y'), \quad (2)$$

where $M(x',y')$ models the mask and $K(x,y;x',y')$ models the source.

The Hopkins model can be used to determine a 4-D (four-dimensional) matrix called the transmission cross-coefficient (TCC) matrix which models the optical system. The TCC matrix can then be represented using a set of orthogonal 2-D (two-dimensional) kernels. The set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics, 2nd Edition*, Dover Publications, 1989.

Process models are usually based on a physical model or a black box model, or a combination thereof. A physical model models the underlying physical process, whereas a black-box model typically uses generic modeling functions. The physical modeling approach is generally preferred because the black-box modeling approach can have a number of drawbacks. First, the generic modeling functions that are used in a black-box model usually require a large amount of empirical data to converge. Second, black-box models are not as accurate as physical models. Specifically, a black-box model is fit to empirical data which is obtained using a test layout. However, this does not guarantee that the model will work accurately with other layouts. Third, the empirical data is usually obtained at a particular process point (i.e., under certain process conditions). Hence, a black-box model that is fit to empirical data for a particular process point may not work accurately under different process conditions, e.g., under defocus or a different exposure energy. Hence, it is generally desirable to use physical models instead of black-box models.

However, determining an appropriate physical model is very challenging. In a typical physical modeling approach, first we have to identify a systematic process variation that is not negligible and which has not been modeled by the process model. Next, we have to identify the underlying physical processes which are causing the systematic variation. Finally, we have to determine a model that accurately models the underlying physical processes without sacrificing runtime performance.

At current integration densities, mask errors are causing non-negligible systematic process variations. Conventional process models do not accurately model these effects because they either completely ignore them, or they try to model the effects using black-box modeling techniques which do not accurately capture the underlying physical processes. In contrast to conventional techniques, some embodiments of the present invention accurately model the impact of mask errors by determining an appropriate physical model.

Figure 6A:
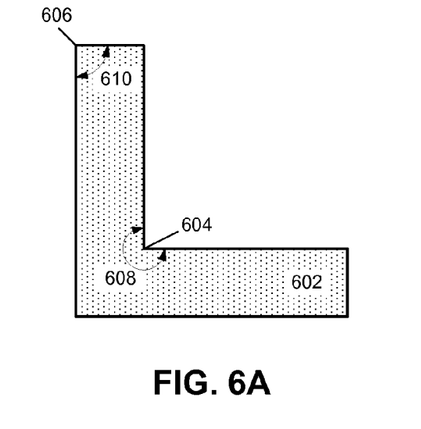
FIG. 6A illustrates a portion of a mask layout in accordance with some embodiments of the present invention.

FIG. 6A illustrates a portion of a mask layout in accordance with some embodiments of the present invention.

Polygon 602 is part of a mask layout and has an inner corner 604 and an outer corner 606. An inner corner is a corner whose interior angle is greater than 180°. For example, the interior angle 608 of inner corner 604 is greater than 180°. Conversely, an outer corner is a corner whose interior angle is less than 180°. For example, the interior angle 610 of outer corner 606 is less than 180°.

Figure 6B:
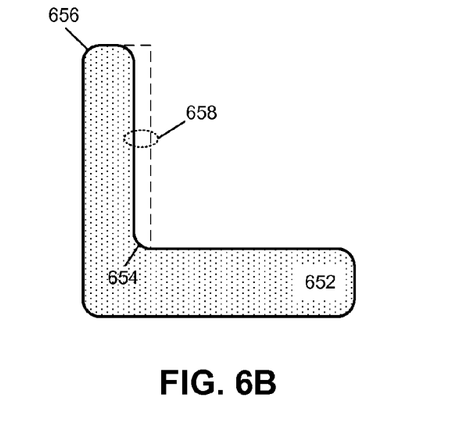
FIG. 6B illustrates a photolithography mask in accordance with some embodiments of the present invention.

FIG. 6B illustrates a photolithography mask in accordance with some embodiments of the present invention.

A photolithography mask is typically fabricated using electron beam lithography. Shapes in the mask layout are usually not transferred perfectly onto the photolithography mask. Specifically, edges may not be created where they are supposed to be created, and sharp angles in the mask layout may become "rounded" (this effect is known as "mask corner rounding"). For example, when polygon 602 shown in FIG. 6A is fabricated, it may create polygon 652 shown in FIG. 6B. Note that the mask writing process has introduced edge bias 658 (the edge should have printed at the dashed line), and mask corner rounding (MCR) effects may cause corners 654 and 656 to become rounded.

Conventional process models typically predict the shapes on the wafer using a mask layout which contains "perfect" polygons, e.g., polygon 602. However, since the actual polygons on the photolithography mask are not "perfect," the results produced by conventional models are inaccurate. Conventional approaches that use black-box models to model mask errors may not be successful because black-box models may not accurately capture the underlying physical processes that affect different types of corners in different ways. For example, the MCR effect on inner corners and outer corners may be different, and this difference may not be properly captured by a black-box model. Furthermore, conventional approaches that model MCR effects using a black-box model can cause the process model to become inaccurate for other types of patterns, e.g., line-and-space patterns.

Optical proximity correction requires process models that are highly efficient and highly accurate. Unfortunately, conventional techniques for modeling mask errors are unsuitable for use in optical proximity correction because the techniques are either inefficient, or inaccurate, or both. Hence, what is needed are systems and techniques to efficiently and accurately model mask errors, especially for use in optical proximity correction.

Some conventional techniques modify corners and edges of polygons in the mask layout to model mask errors. Note that these techniques typically need to perform a large number of mask layout modifications during model fitting. Unfortunately, performing such modifications is computationally costly, which causes these techniques to be inefficient. Further, since the granularity of the modifications is limited by the resolution of the GDS grid, the models generated by these techniques are inaccurate. For at least these reasons, such conventional techniques for modeling mask errors are inefficient and inaccurate. (Note that GDS is a widely used format for representing the layout of an integrated circuit.)

Some embodiments of the present invention use aerial image sensitivity to model mask errors. Specifically, in some embodiments, the optical signal (e.g., the aerial image intensity) on the optics imaging plane is decomposed into two parts: an ideal signal and a deviation. The ideal signal is essentially the signal that would be created by an ideal mask (i.e., a mask without any mask errors), and the deviation signal is the deviation from the ideal signal due to mask errors.

The aerial image intensity model that models mask errors can be represented as follows:

$$I_E = I_0 + \sum_i C_i \cdot \frac{dI}{dX_i}, \quad (3)$$

where, $I_E$ is the aerial image intensity that accounts for mask errors, $I_0$ is the aerial image intensity from an ideal mask (i.e., a mask without any mask errors), $$\frac{dI}{dX_i}$$

is the sensitivity of the aerial image intensity to the type of mask modification that models a certain type of mask error, $C_i$ is a coefficient which is fit to empirical data. Note that coefficients $C_i$ can be constants, or can be functions of local pattern density.

The sensitivity of the aerial image intensity to the $i^{th}$ type of mask modification can be computed as follows:

$$\frac{dI}{dX_i} = \frac{I_p(M_i') - I_p(M)}{\delta_i}, \quad (4)$$

where $\frac{dI}{dX_i}$ is the sensitivity of the aerial image intensity to the $i^{th}$ type of mask modification that models a certain type of mask error, $\delta_i$ is the amount of mask modification, M is the ideal mask layout (i.e., the mask layout without any mask modifications), $M_i'$ is a modified mask layout that is obtained by applying a $\delta_i$ amount of the $i^{th}$ type of mask modification to the ideal mask layout, $I_p(M_i')$ is the aerial image intensity value at evaluation point p when computed using modified mask layout $M_i'$, and $I_p(M)$ is the aerial image intensity value at evaluation point p when computed using ideal mask layout M.

In some embodiments, the deviation signal can be decomposed into two terms: an edge bias term and a corner rounding term. The edge bias term models the deviation from the ideal signal due to edge bias errors in the mask layout. The corner rounding term models the deviation from the ideal signal due to MCR effects.

The aerial image intensity model that models mask errors can be represented as follows:

$$I_E = I_0 + C_{bias} \cdot \frac{dI}{dE} + C_{MCR} \cdot \frac{dI}{dMCR}, \quad (5)$$

where, $I_E$ is the aerial image intensity that accounts for mask errors, $I_0$ is the aerial image intensity from an ideal mask (i.e., a mask without any mask errors), $$\frac{dI}{dE}$$

is the sensitivity of the aerial image intensity to mask edge bias, $C_{bias}$ is an edge bias coefficient which is fit to empirical data, $$\frac{dI}{dMCR}$$

is the sensitivity of the aerial image intensity to mask corner rounding, and $C_{MCR}$ is a corner rounding coefficient which is fit to empirical data. Note that coefficients $C_E$ and $C_{MCR}$ can be constants, or can be functions of local pattern density.

During model calibration, aerial image sensitivity is obtained by applying a known amount of a mask modification, e.g., an edge bias or a mask corner rounding to a mask, and then determining the difference in the aerial image intensity. Note that the aerial image sensitivity can be determined at any location in the mask layout. However, the aerial image sensitivity is typically determined at printed edges during model calibration.

As mentioned above, coefficients $C_{bias}$ and $C_{MCR}$ can be constants, in which case they can be directly fit (e.g., via regression) to measured CD values. In some embodiments, these coefficients can be functions of pattern density, in which case the coefficients of the function can be fit (e.g., via regression) during model calibration.

Figure 7A:
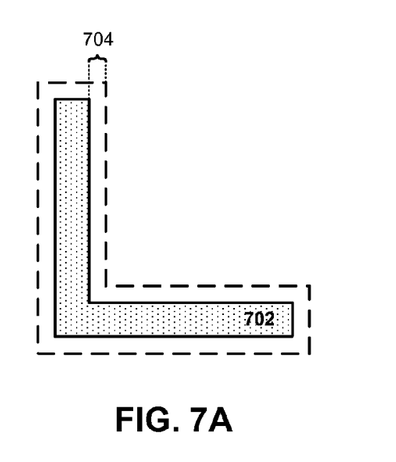
FIG. 7A illustrates how aerial image sensitivity to mask edge bias can be determined in accordance with some embodiments of the present invention.

FIG. 7A illustrates how aerial image sensitivity to mask edge bias can be determined in accordance with some embodiments of the present invention.

The system can apply an edge bias to a mask layout to obtain an edge-biased mask layout. For example, the system can apply edge bias 704 to the edges of polygon 602 in FIG. 6A to obtain polygon 702. Note that the dashed line in FIG. 7A represents the contour of polygon 602. Next, the system can determine the aerial image intensity value at an evaluation point using the ideal mask layout, and the aerial image intensity value at the evaluation point using the edge-biased mask layout. The system can then divide the difference in the aerial image intensities by edge bias 704 to obtain the sensitivity of the aerial image intensity to mask edge bias.

The edge bias sensitivity can be computed as follows:

$$\frac{dI}{dE} = \frac{I_p(M') - I_p(M)}{\delta_{bias}}, \quad (6)$$

where $\frac{dI}{dE}$ is the sensitivity of the aerial image intensity to mask edge bias, $\delta_{bias}$ is the amount of edge bias, M is the ideal mask layout (i.e., the mask layout without an edge bias), M' is the edge-biased mask layout (i.e., the mask layout obtained by biasing mask layout M by $\delta_{bias}$), $I_p(M')$ is the aerial image intensity value at evaluation point p when computed using edge-biased mask layout M', and $I_p(M)$ is the aerial image intensity value at evaluation point p when computed using ideal mask layout M.

Figure 7B:
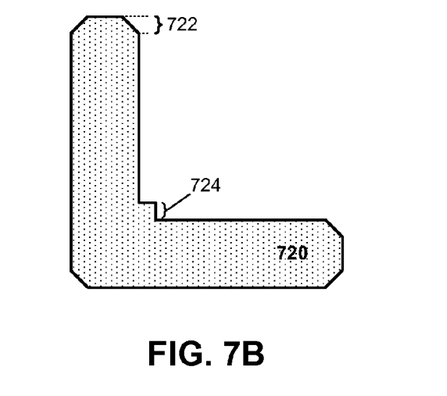
FIG. 7B illustrates how aerial image sensitivity to mask corner rounding can be determined in accordance with some embodiments of the present invention.

FIG. 7B illustrates how aerial image sensitivity to mask corner rounding can be determined in accordance with some embodiments of the present invention.

The system can apply an amount of mask corner rounding to a mask layout to obtain a rounded mask layout. For example, the system can apply mask corner rounding to the edges of polygon 602 in FIG. 6A to obtain polygon 720. Note that the amount of mask corner rounding can refer to the size of an artifact that is added to a corner to model mask corner rounding. For example, amount of mask corner rounding 722 refers to the size of the bevel that was added to the polygon's corner to model mask corner rounding. Similarly, amount of mask corner rounding 724 refers to the size of the notch that was added to the polygon's corner to model mask corner rounding. Note that when the system applies mask corner rounding to a mask layout, the system can treat inside corners and outside corners differently. For example, as shown in FIG. 7B, the system can add a bevel artifact to outside corners and a notch artifact to inside corners.

Next, the system can determine the aerial image intensity value at an evaluation point using the ideal mask layout, and the aerial image intensity value at the evaluation point using the rounded mask layout. The system can then divide the difference in the aerial image intensities by the amount of mask corner rounding to obtain the sensitivity of the aerial image intensity to mask corner rounding.

The mask corner rounding sensitivity can be computed as follows:

$$\frac{dI}{dMCR} = \frac{I_p(M') - I_p(M)}{\delta_{MCR}}, \quad (7)$$

where $\frac{dI}{dMCR}$ is the sensitivity of the aerial image intensity to mask corner rounding, $\delta_{MCR}$ is the amount of mask corner rounding, M is the ideal mask layout (i.e., the mask layout without mask corner rounding), M' is the rounded mask layout (i.e., the mask layout obtained by applying a $\delta_{MCR}$ amount of mask corner rounding to mask layout M), $I_p(M')$ is the aerial image intensity value at evaluation point p when computed using rounded mask layout M', and $I_p(M)$ is the aerial image intensity value at evaluation point p when computed using ideal mask layout M.

The edge bias mask modification and the mask corner rounding mask modification have been presented only for purposes of illustration and description. They are not intended to be exhaustive or to limit the present invention to the forms disclosed. Accordingly, many variations will be apparent to practitioners skilled in the art.

Figure 7C:
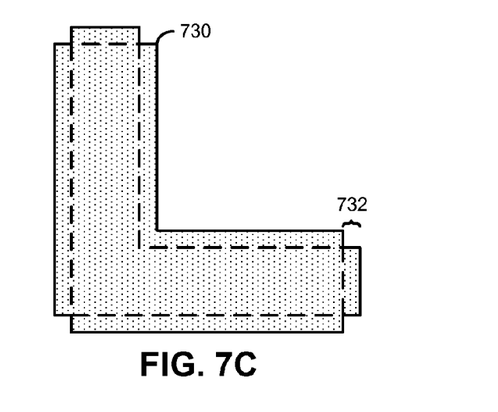
FIG. 7C illustrates a variation of a mask edge bias modification in accordance with some embodiments of the present invention.

For example, FIG. 7C illustrates a variation of a mask edge bias modification in accordance with some embodiments of the present invention.

The system can apply edge bias 732 to the edges of polygon 602 in FIG. 6A to obtain polygon 730. The edges of polygon 602 are shown as dashed lines in FIG. 7C. Note that polygon 730 is different from polygon 702.

Figure 8:
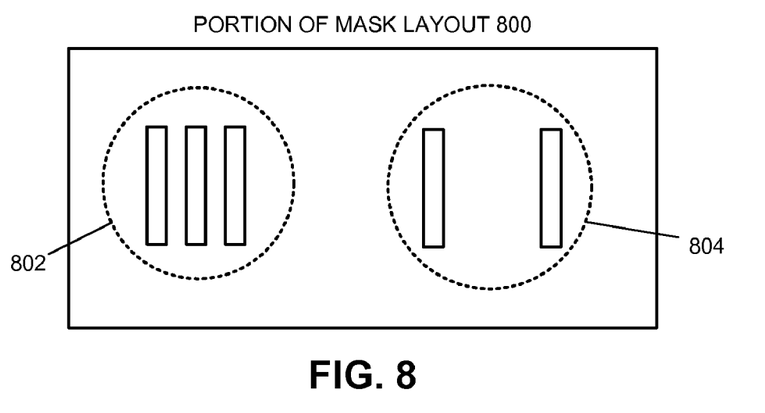
FIG. 8 illustrates how the sensitivity coefficients can depend on the local pattern density in accordance with some embodiments of the present invention.

FIG. 8 illustrates how the sensitivity coefficients can depend on the local pattern density in accordance with some embodiments of the present invention.

Portion of mask layout 800 includes high pattern density region 802 and low pattern density region 804. The type and extent of mask errors can depend on the local pattern density. Hence, in some embodiments, the sensitivity coefficients $C_{bias}$ and $C_{MCR}$ are functions of the local pattern density.

The local pattern density at an evaluation point can be computed by convolving the mask layout with an averaging kernel, e.g., a Gaussian kernel. Next, the sensitivity coefficients can be expressed as a function, e.g., a polynomial, of the computed density value.

Note that, when a sensitivity coefficient is a constant, the coefficient is fitted during model calibration. However, when the sensitivity coefficient is a function of the density, the parameters of the function are fitted during model calibration. For example, suppose $C_{bias}=aD^2+bD+c$, where D is the local pattern density at an evaluation point. The values of parameters a, b, and c can be fitted during model calibration.

Note that embodiments of the present invention provide a process model that is efficient and accurate. Specifically, during process model fitting, the system does not need to perform a large number of mask layout modifications. Further, the system is not limited by the GDS resolution because the system uses sensitivity coefficients which can be floating point values. Note that the edge-biased mask layout and the rounded mask layout can be pre-computed, thereby obviating the need to compute these mask layouts during OPC.

Figure 9:
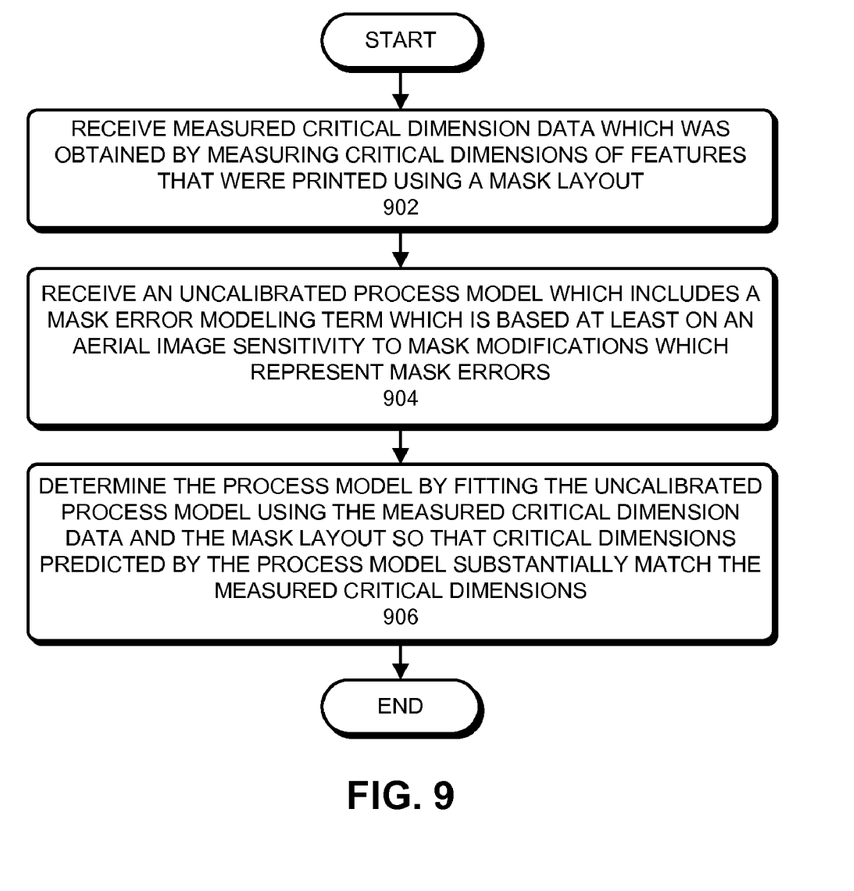
FIG. 9 presents a flowchart that illustrates a process for determining a process model in accordance with some embodiments of the present invention.

FIG. 9 presents a flowchart that illustrates a process for determining a process model in accordance with some embodiments of the present invention.

The process can begin by receiving measured critical dimension (CD) data which was obtained by measuring CDs of features that were printed using a mask layout (step 902).

Next, the system can receive an uncalibrated process model which includes a mask error modeling term which is based at least on an aerial image sensitivity to mask modifications which represent mask errors (step 904). The mask error modeling term can include an edge bias term and/or a corner rounding term. The edge bias term's value at an evaluation point in the mask layout may be based on an edge bias coefficient and the sensitivity of the aerial image intensity at the evaluation point to an edge bias. The corner rounding term's value at the evaluation point may be based on a corner rounding coefficient and the sensitivity of the aerial image intensity at the evaluation point to a corner rounding adjustment. As mentioned previously, the edge bias coefficient and/or the corner rounding coefficient can be based on a local pattern density and/or other parameters.

The system can then determine the process model by fitting the uncalibrated process model using the measured CD data and the mask layout so that CDs predicted by the process model substantially match the measured CDs (step 906). Fitting the uncalibrated process model using the measured CD data and the mask layout can involve using a statistical fitting technique to fit the edge bias coefficient and the corner rounding coefficient. For example, the system can use linear regression to determine the coefficients.

In some embodiments, the system can use a generic optimization technique to determine the sensitivity coefficients. Specifically, the system can define a cost function that includes a residual error term which is equal to the difference between the predicted CDs and the measured CDs. Next, the system can use the optimization technique to determine the values of the sensitivity coefficients which minimize the value of the cost function.

Figure 10:
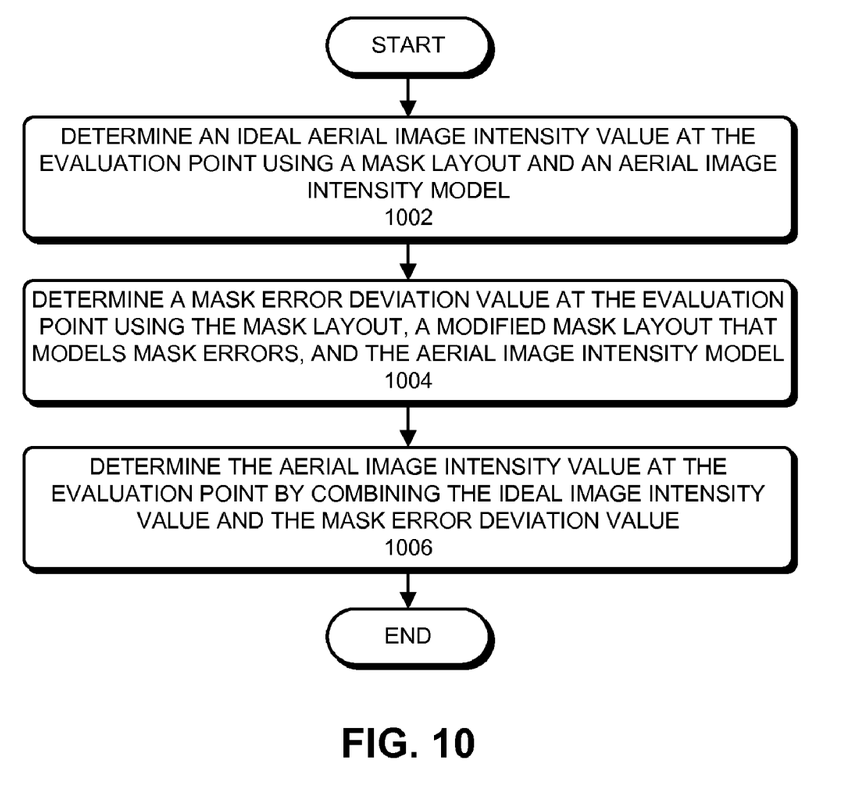
FIG. 10 presents a flowchart that illustrates a process for determining an aerial image intensity value at an evaluation point in accordance with some embodiments of the present invention.

FIG. 10 presents a flowchart that illustrates a process for determining an aerial image intensity value at an evaluation point in accordance with some embodiments of the present invention.

The process can begin by determining an ideal aerial image intensity value at the evaluation point using a mask layout and an aerial image intensity model (step 1002).

Next, the system can determine a mask error deviation value at the evaluation point using the mask layout, a modified mask layout that models mask errors, and the aerial image intensity model (step 1004). The mask error deviation value can include an edge bias deviation value and/or a corner rounding deviation value.

The edge bias deviation value at the evaluation point can be determined using an edge-biased mask layout, the mask layout, and the aerial image intensity model. Specifically, the system can determine the edge bias deviation value by computing a product of an edge bias coefficient and an edge bias sensitivity value of the aerial image intensity at the evaluation point. Note that, in some embodiments, the edge bias coefficient can be a function of a local pattern density value at the evaluation point.

The corner rounding deviation value at the evaluation point can be determined using a rounded mask layout, the mask layout, and the aerial image intensity model. Specifically, the system can determine the corner rounding deviation value at the evaluation point by computing a product of a corner rounding coefficient and a corner rounding sensitivity value of the aerial image intensity at the evaluation point. Note that, in some embodiments, the corner rounding coefficient is a function of a local pattern density value at the evaluation point.

Next, the system can determine the aerial image intensity value at the evaluation point by combining the ideal aerial image intensity value and the mask error deviation value (step 1006).

Figure 11:
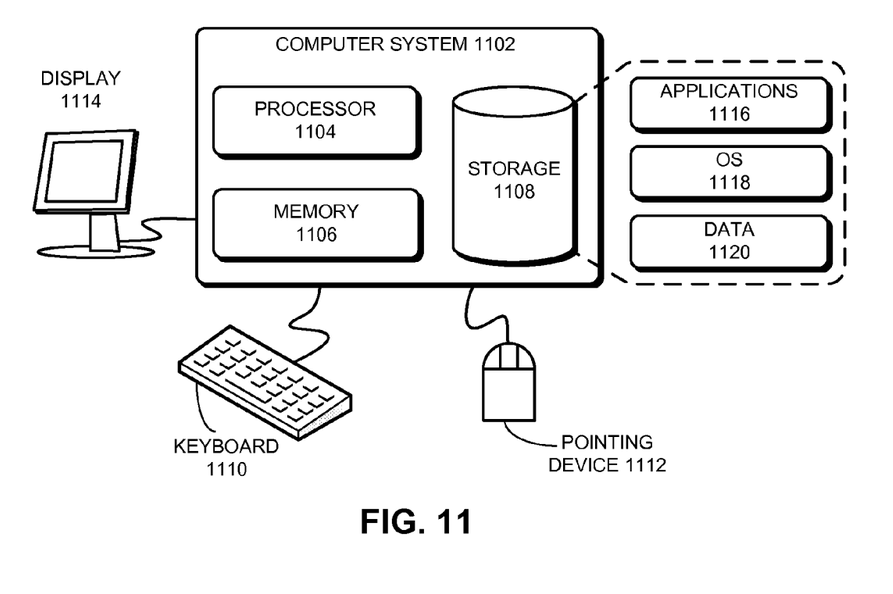
FIG. 11 illustrates a computer system in accordance with some embodiments of the present invention.

FIG. 11 illustrates a computer system in accordance with some embodiments of the present invention.

A computer or computer system can generally be any system that can perform computations. Specifically, a computer can be a microprocessor-based system which may include multiple processing cores, a network-processor-based system, a digital-signal-processor-based system, a portable computing device, a personal organizer, a distributed-computing-platform-based system, or any other computing system now known or later developed.

Computer system 1102 comprises processor 1104, memory 1106, and storage 1108. Computer system 1102 can be coupled with display 1114, keyboard 1110, and pointing device 1112. Storage 1108 can generally be any device that can store data. Specifically, a storage device can be a magnetic, an optical, or a magneto-optical storage device, or it can be based on flash memory and/or battery-backed up memory. Storage 1108 can store applications 1116, operating system 1118, and data 1120.

Applications 1116 can include instructions that when executed by computer 1102 cause computer 1102 to perform one or more processes described in this disclosure. Data 1120 can include mask layouts, sensitivity coefficients, and/or any other data that is inputted or outputted by one or more processes described in this disclosure.

Figure 12:
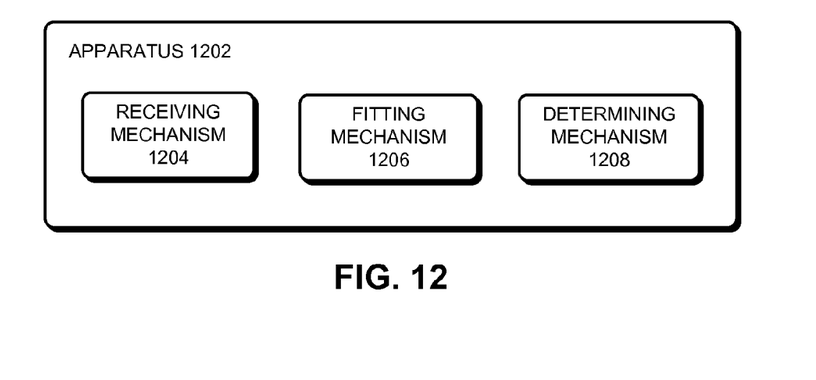
FIG. 12 illustrates an apparatus in accordance with some embodiments of the present invention.

FIG. 12 illustrates an apparatus in accordance with some embodiments of the present invention.

Apparatus 1202 can comprise a number of mechanisms which may communicate with one another via a wired or wireless communication channel. Apparatus 1202 may be realized using one or more integrated circuits. Apparatus 1202 may be integrated with a computer system, or it may be realized as a separate device which is capable of communicating with other computer systems and/or devices. Apparatus 1202 may include more or fewer mechanisms than those shown in FIG. 12.

In some embodiments, apparatus 1202 can comprise receiving mechanism 1204 and fitting mechanism 1206. Receiving mechanism 1204 can be configured to receive measured CD data and an uncalibrated process model which includes an edge bias term and a corner rounding term. Fitting mechanism 1206 can be configured to fit the uncalibrated process model using the measured CD data and the mask layout so that CDs predicted by the process model substantially match the measured CDs.

In some embodiments, apparatus 1202 can comprise determining mechanism 1208, which can be configured to determine an ideal aerial image intensity value, an edge bias deviation value, and a corner rounding deviation value. Determining mechanism 1208 can also be configured to determine the aerial image intensity value by combining the ideal aerial image intensity value, the edge bias deviation value, and the corner rounding deviation value.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-executed method for determining a process model, the method comprising:

receiving measured critical dimension (CD) data which was obtained by measuring CDs of features that were printed using a mask layout;

receiving an uncalibrated process model which includes a mask error modeling term which is based at least on an aerial image sensitivity to mask modifications which represent mask errors; and determining the process model by fitting the uncalibrated process model using the measured CD data and the mask layout so that CDs predicted by the process model substantially match the measured CDs.

2. The computer-executed method of claim 1, wherein determining the process model by fitting the uncalibrated process model using the measured CD data and the mask layout includes using a statistical fitting technique to fit an edge bias coefficient and a corner rounding coefficient.

3. The computer-executed method of claim 1, wherein the mask error modeling term includes one or more of:

an edge bias term whose value at an evaluation point in the mask layout is based at least on an edge bias coefficient and a sensitivity of the aerial image intensity at the evaluation point to an edge bias; and a corner rounding term whose value at the evaluation point is based at least on a corner rounding coefficient and a sensitivity of the aerial image intensity at the evaluation point to a corner rounding adjustment.

4. The computer-executed method of claim 3, wherein the edge bias coefficient is based at least on a local pattern density at the evaluation point.

5. The computer-executed method of claim 3, wherein the corner rounding coefficient is based at least on a local pattern density at the evaluation point.

6. A non-transitory computer-readable storage medium storing instructions that upon execution by a computer cause the computer to perform operations for determining a process model, the operations comprising:

receiving measured critical dimension (CD) data which was obtained by measuring CDs of features that were printed using a mask layout;

receiving an uncalibrated process model which includes a mask error modeling term which is based at least on an aerial image sensitivity to mask modifications which represent mask errors; and determining the process model by fitting the uncalibrated process model using the measured CD data and the mask layout so that CDs predicted by the process model substantially match the measured CDs.

7. The computer-readable storage medium of claim 6, wherein determining the process model by fitting the uncalibrated process model using the measured CD data and the mask layout includes using a statistical fitting technique to fit an edge bias coefficient and a corner rounding coefficient.

8. The computer-readable storage medium of claim 6, wherein the mask error modeling term includes one or more of:

an edge bias term whose value at an evaluation point in the mask layout is based at least on an edge bias coefficient and a sensitivity of the aerial image intensity at the evaluation point to an edge bias; and a corner rounding term whose value at the evaluation point is based at least on a corner rounding coefficient and a sensitivity of the aerial image intensity at the evaluation point to a corner rounding adjustment.

9. The computer-readable storage medium of claim 8, wherein the edge bias coefficient is based at least on a local pattern density at the evaluation point.

10. The computer-readable storage medium of claim 8, wherein the corner rounding coefficient is based at least on a local pattern density at the evaluation point.

11. A computer-executed method for determining an aerial image intensity value at an evaluation point, the method comprising:

determining an ideal aerial image intensity value at the evaluation point using a mask layout and an aerial image intensity model;

determining a mask error deviation value at the evaluation point using the mask layout, a modified mask layout that models mask errors, and the aerial image intensity model; and determining the aerial image intensity value at the evaluation point by combining the ideal aerial image intensity value and the mask error deviation value.

12. The computer-executed method of claim 11, wherein determining the mask error deviation value at the evaluation point includes computing a product of an edge bias coefficient and an edge bias sensitivity value of the aerial image intensity at the evaluation point.

13. The computer-executed method of claim 12, wherein the edge bias coefficient is a function of a local pattern density value at the evaluation point.

14. The computer-executed method of claim 11, wherein determining the mask error deviation value at the evaluation point includes computing a product of a corner rounding coefficient and a corner rounding sensitivity value of the aerial image intensity at the evaluation point.

15. The computer-executed method of claim 14, wherein the corner rounding coefficient is a function of a local pattern density value at the evaluation point.

16. A non-transitory computer-readable storage medium storing instructions that upon execution by a computer cause the computer to perform operations for determining an aerial image intensity value at an evaluation point, the operations comprising:

determining an ideal aerial image intensity value at the evaluation point using a mask layout and an aerial image intensity model;

determining a mask error deviation value at the evaluation point using the mask layout, a modified mask layout that models mask errors, and the aerial image intensity model; and determining the aerial image intensity value at the evaluation point by combining the ideal aerial image intensity value and the mask error deviation value.

17. The computer-readable storage medium of claim 16, wherein determining the mask error deviation value at the evaluation point includes computing a product of an edge bias coefficient and an edge bias sensitivity value of the aerial image intensity at the evaluation point.

18. The computer-readable storage medium of claim 17, wherein the edge bias coefficient is a function of a local pattern density value at the evaluation point.

19. The computer-readable storage medium of claim 16, wherein determining the mask error deviation value at the evaluation point includes computing a product of a corner rounding coefficient and a corner rounding sensitivity value of the aerial image intensity at the evaluation point.

20. The computer-readable storage medium of claim 19, wherein the corner rounding coefficient is a function of a local pattern density value at the evaluation point.

* * * * *